United States Patent
Horita et al.

(10) Patent No.: US 12,132,507 B2
(45) Date of Patent: Oct. 29, 2024

(54) RADIO-FREQUENCY MODULE AND COMMUNICATION DEVICE

(71) Applicant: Murata Manufacturing Co., Ltd., Nagaokakyo (JP)

(72) Inventors: Atsushi Horita, Nagaokakyo (JP); Yukiya Yamaguchi, Nagaokakyo (JP); Morio Takeuchi, Nagaokakyo (JP); Shigeru Tsuchida, Nagaokakyo (JP); Tomoaki Sato, Nagaokakyo (JP); Rui Tanaka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 639 days.

(21) Appl. No.: 17/346,308

(22) Filed: Jun. 14, 2021

(65) Prior Publication Data

US 2022/0021404 A1 Jan. 20, 2022

(30) Foreign Application Priority Data

Jul. 16, 2020 (JP) .................................. 2020-122418

(51) Int. Cl.
*H04B 1/00* (2006.01)
*H03F 1/02* (2006.01)
*H03F 3/21* (2006.01)
*H03F 3/24* (2006.01)
(Continued)

(52) U.S. Cl.
CPC .............. *H04B 1/006* (2013.01); *H03F 3/245* (2013.01); *H04B 1/0057* (2013.01); *H04W 52/52* (2013.01); *H03F 2200/294* (2013.01); *H03F 2200/451* (2013.01)

(58) Field of Classification Search
None
See application file for complete search history.

(56) References Cited

U.S. PATENT DOCUMENTS

| | | | |
|---|---|---|---|
| 9,774,301 B1* | 9/2017 | Maalouf | H03F 3/24 |
| 2004/0189381 A1* | 9/2004 | Louis | H03F 3/602 |
| | | | 330/124 R |
| 2016/0241209 A1* | 8/2016 | Lehtola | H03F 1/0288 |

FOREIGN PATENT DOCUMENTS

| | | |
|---|---|---|
| JP | 2018-137522 A | 8/2018 |
| WO | 2019/181590 A1 | 9/2019 |
| WO | 2019/244815 A1 | 12/2019 |

OTHER PUBLICATIONS

Korean Office Action issued Jan. 21, 2022 in Korean Application No. 10-2021-0072030.

* cited by examiner

*Primary Examiner* — Pablo N Tran
(74) *Attorney, Agent, or Firm* — XSENSUS LLP

(57) ABSTRACT

A radio-frequency module includes a mounting substrate, a first power amplifier, a second power amplifier, a circuit component (IC chip), and an external connection terminal. The mounting substrate has a first main surface and a second main surface on opposite sides of the mounting substrate. The first power amplifier is mounted on the first main surface of the mounting substrate. The second power amplifier is mounted on the first main surface of the mounting substrate. The circuit component is mounted on the second main surface of the mounting substrate. The external connection terminal is disposed on the second main surface of the mounting substrate. The external connection terminal is connected to a power supply that supplies a power supply voltage to the first power amplifier and the second power amplifier.

19 Claims, 7 Drawing Sheets

(51) Int. Cl.
*H04B 1/04* (2006.01)
*H04W 52/52* (2009.01)

RADIO-FREQUENCY MODULE AND COMMUNICATION DEVICE

CROSS-REFERENCE TO RELATED APPLICATION

The present application claims priority to Japanese patent application JP2020-122418, filed Jul. 16, 2020, the entire contents of which being incorporated herein by reference.

BACKGROUND

1. Field

The present disclosure generally relates to a radio-frequency module and a communication device and more specifically relates to a radio-frequency module that includes two power amplifiers and a communication device including the radio-frequency module.

2. Description of the Related Art

Japanese Unexamined Patent Application Publication No. 2018-137522 discloses a radio-frequency module that includes power amplification circuits (power amplifiers).

In addition, Japanese Unexamined Patent Application Publication No. 2018-137522 discloses a communication device that includes the radio-frequency module.

It is sometimes necessary to reduce the size of a mounting substrate on which the above-described power amplification circuits and so forth are mounted in the radio-frequency module.

SUMMARY

An aspect of the present disclosure is to provide a radio-frequency module and a communication device that enables a mounting substrate to be reduced in size.

A radio-frequency module according to an aspect of the present disclosure includes a mounting substrate, a first power amplifier, a second power amplifier, a circuit component, and an external connection terminal. The mounting substrate has a first main surface and a second main surface on opposite sides of the substrate. The first power amplifier is mounted on the first main surface of the mounting substrate. The second power amplifier is mounted on the first main surface of the mounting substrate. The circuit component is a different component from the first power amplifier and the second power amplifier and is mounted on the second main surface of the mounting substrate. The external connection terminal is disposed on the second main surface of the mounting substrate. The external connection terminal is connected to a power supply that supplies a power supply voltage to the first power amplifier and the second power amplifier. The external connection terminal is connected to both the first power amplifier and the second power amplifier.

A communication device according to an aspect of the present disclosure includes the above-described radio-frequency module and a signal processing circuit. The signal processing circuit is connected to the radio-frequency module.

The radio-frequency module and communication device according to the aspects of the present disclosure enable a mounting substrate to be reduced in size.

Other features, elements, characteristics, and advantages of the present disclosure will become more apparent from the following detailed description of preferred embodiments of the present disclosure with reference to the attached drawings.

DESCRIPTION OF THE PREFERRED EMBODIMENTS

Figure 1:
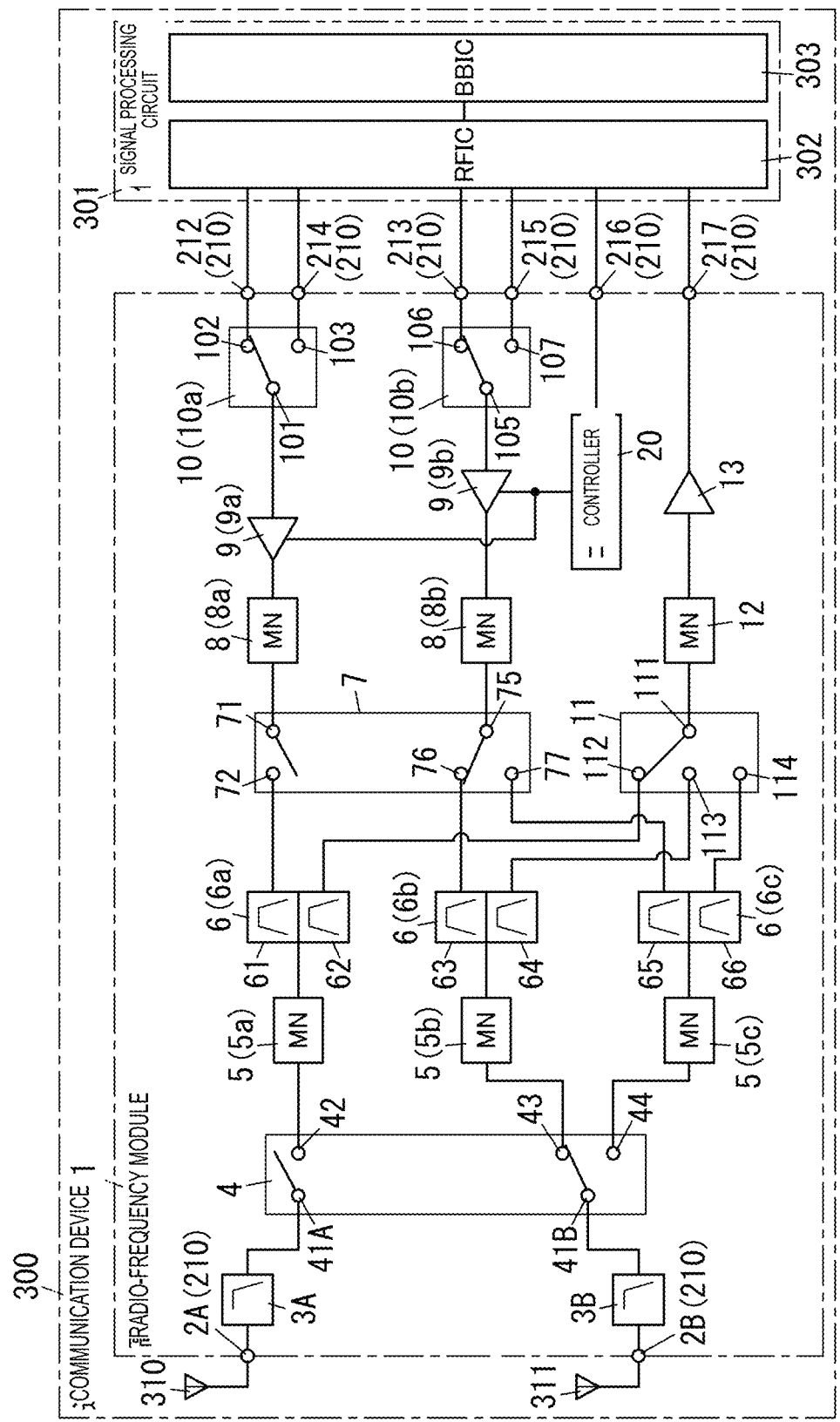
FIG. 1 is a circuit configuration diagram of a communication device that includes a radio-frequency module according to Embodiment 1.

FIGS. 3A to 6 and 8A and 8B, which are referred to in the following Embodiments 1 and 2 and so forth, are all schematic diagrams, and the ratios of the sizes and thicknesses of the individual constituent elements in the diagrams do not necessarily reflect the actual dimensional ratios.

Embodiment 1

As illustrated in FIGS. 3A and 3B, a radio-frequency module 1 according to Embodiment 1 includes a mounting substrate 14, a first power amplifier 9a, a second power amplifier 9b, a circuit component (for example, IC chip 28), and external connection terminals (first power supply terminal 218 and second power supply terminal 219). The mounting substrate 14 has a first main surface 141 and a second main surface 142, which are on opposite sides of the mounting substrate 14. The first power amplifier 9a is mounted on the first main surface 141 of the mounting substrate 14. The second power amplifier 9b is mounted on the first main surface 141 of the mounting substrate 14. The circuit component is mounted on the second main surface 142 of the mounting substrate 14. The external connection terminals are disposed on the second main surface 142 of the mounting substrate 14. The external connection terminals are connected to power supplies (first power supply 21 and second power supply 22) that supply power supply voltages to the first power amplifier 9a and the second power amplifier 9b. The external connection terminals are connected to both the first power amplifier 9a and the second power amplifier 9b. This makes it possible to reduce the size of the mounting substrate 14 in the radio-frequency module 1 according to Embodiment 1.

Hereafter, the radio-frequency module 1 and a communication device 300 according to Embodiment 1 will be described while referring to FIGS. 1 to 6.

1. Radio-Frequency Module and Communication Device 1.1 Circuit Configurations of Radio-Frequency Module and Communication Device First, the circuit configurations of the radio-frequency module 1 and the communication device 300 according to Embodiment 1 will be described while referring to FIGS. 1 and 2.

The radio-frequency module 1 according to Embodiment 1 is, for example, used in the communication device 300, which supports multiple modes and multiple bands. The communication device 300 is, for example, a mobile phone (for example, a smartphone), but is not limited to being a mobile phone and, for example, may instead be a wearable terminal (for example, a smartwatch). The radio-frequency module 1 is, for example, a module that can support the fourth generation mobile communication (4G) standard and the fifth generation mobile communication (5G) standard. The 4G standard is, for example, the 3GPP long term evolution (LTE) standard. The 5G standard is, for example, 5G new radio (NR). The radio-frequency module 1 is, for example, a module that can support carrier aggregation and dual connectivity. Here, "carrier aggregation" and "dual connectivity" refer to communications in which radio waves of a plurality of frequency bands are used simultaneously.

The radio-frequency module 1 according to Embodiment 1 simultaneously performs communication of a signal of a frequency band stipulated in 4G and communication of a signal of another frequency band stipulated in 4G. In addition, the radio-frequency module 1 according to Embodiment 1 simultaneously performs communication of a signal of a frequency band stipulated in 4G and communication of a signal of a frequency band stipulated in 5G. Furthermore, the radio-frequency module 1 according to Embodiment 1 simultaneously performs communication of a signal of a frequency band stipulated in 5G and communication of a signal of another frequency band stipulated in 5G. Hereafter, communication performed using carrier aggregation or dual connectivity will also be referred to as simultaneous communication.

The radio-frequency module 1 is, for example, configured so as to be able to amplify transmission signals (radio-frequency signals) input from a signal processing circuit 301 and output the amplified transmission signals to a first antenna 310 and a second antenna 311. In addition, the radio-frequency module 1 is configured so as to be able to amplify reception signals (radio-frequency signals) input from the first antenna 310 and the second antenna 311 and output the amplified reception signals to the signal processing circuit 301. The signal processing circuit 301 is not a constituent element of the radio-frequency module 1 but rather is a constituent element of the communication device 300 that includes the radio-frequency module 1. The radio-frequency module 1 is, for example, controlled by the signal processing circuit 301 of the communication device 300. The communication device 300 includes the radio-frequency module 1 and the signal processing circuit 301. The communication device 300 further includes the first antenna 310 and the second antenna 311. The communication device 300 further includes a circuit substrate on which the radio-frequency module 1 is mounted. The circuit substrate is, for example, a printed wiring board. The circuit substrate has a ground electrode to which a ground potential is given.

The signal processing circuit 301 includes, for example, an RF signal processing circuit 302 and a baseband signal processing circuit 303. The RF signal processing circuit 302 is, for example, a radio-frequency integrated circuit (RFIC) and performs signal processing on radio-frequency signals. The RF signal processing circuit 302, for example, performs signal processing such as up conversion on a radio-frequency signal (transmission signal) output from the baseband signal processing circuit 303 and outputs the radio-frequency signal resulting from this signal processing to the radio-frequency module 1. In addition, the RF signal processing circuit 302, for example, performs signal processing such as down conversion on a radio-frequency signal (reception signal) output from the radio-frequency module 1 and outputs the radio-frequency signal resulting from this signal processing to the baseband signal processing circuit 303.

The baseband signal processing circuit 303 is, for example, a baseband integrated circuit (BBIC). The baseband signal processing circuit 303 generates an I phase signal and a Q phase signal from a baseband signal. The baseband signal is, for example, an audio signal, an image signal, or the like input from the outside. The baseband signal processing circuit 303 performs IQ modulation processing by combining the I phase signal and the Q phase signal, and outputs a transmission signal. At this time, the transmission signal is generated as a modulated signal (IQ signal) by performing amplitude modulation on a carrier signal of a prescribed frequency using a longer period than the period of the carrier signal. A reception signal generated through processing performed by the baseband signal processing circuit 303 is used for image display as an image signal or for a phone call as an audio signal, for example. The radio-frequency module 1 transmits radio-frequency signals (reception signals and transmission signals) between the first antenna 310 and the second antenna 311 and the RF signal processing circuit 302 of the signal processing circuit 301.

The radio-frequency module 1 includes a plurality of (two in the illustrated example) power amplifiers 9 and a low-noise amplifier 13. In addition, the radio-frequency module 1 includes a plurality of (three in the illustrated example) filters 6 and a plurality of (two in the illustrated example) low pass filters 3A and 3B. In addition, the radio-frequency module 1 includes a plurality of (two in the illustrated example) of output matching networks 8, an input matching network 12, and a plurality of (three in the illustrated example) matching networks 5. Furthermore, the radio-frequency module 1 includes a first switch 4, a second switch 7, a third switch 11, and a plurality of (two in the illustrated example) fourth switches 10. In addition, the radio-frequency module 1 includes a controller 20.

Furthermore, the radio-frequency module 1 includes a plurality of external connection terminals 210. The plurality of external connection terminals 210 includes a plurality of (two in the illustrated example) antenna terminals 2A and 2B, a plurality of (two in the illustrated example) first signal input terminals 212 and 214, a plurality of (two in the illustrated example) second signal input terminals 213 and 215, control terminals 216, a signal output terminal 217, and a plurality of ground terminals 211 (refer to FIGS. 3B and 4). In addition, the plurality of external connection terminals 210 further includes a plurality of power supply terminals 218 and 219. The ground terminals 211 are terminals which are electrically connected to ground electrodes of the above-described circuit substrate of the communication device 300 and to which a ground potential is given.

In the following description, when it is necessary to distinguish between the plurality of low pass filters 3A and 3B, the low pass filters 3A and 3B will be respectively referred to as a first low pass filter 3A and a second low pass filter 3B. Furthermore, when it is necessary to distinguish between the plurality of matching networks 5, the matching networks 5 will be respectively referred to as a first matching network 5a, a second matching network 5b, and a third matching network 5c. In addition, when it is necessary to distinguish between the plurality of filters 6, the filters 6 will be respectively referred to as a first filter 6a, a second filter 6b, and a third filter 6c. Furthermore, when it is necessary to distinguish between the plurality of output matching networks 8, the output matching networks 8 will be respectively referred to as a first output matching network 8a and a second output matching network 8b. In addition, when it is necessary to distinguish between the plurality of power amplifiers 9, the power amplifiers 9 will be respectively referred to as a first power amplifier 9a and a second power amplifier 9b. Furthermore, when it is necessary to distinguish between the plurality of fourth switches 10, the fourth switches 10 will be respectively referred to as a high-band fourth switch 10a and a middle-band fourth switch 10b.

The first power amplifier 9a has a first input terminal and a first output terminal. The first power amplifier 9a amplifies a transmission signal of a first frequency band input to the first input terminal and outputs the amplified transmission signal from the first output terminal. The first frequency band includes a transmission band of a communication band used in time division duplexing (TDD), for example. In more detail, the first frequency band includes a transmission band of a first communication band used in TDD. The first communication band corresponds to a transmission signal that passes through a first transmission filter 61 of the first filter 6a and is, for example, Band 40 or Band 41 of the 3GPP LTE standard or n41 of 5GNR.

The first input terminal of the first power amplifier 9a is selectably connected to the two first signal input terminals 212 and 214 via the high-band fourth switch 10a. The first input terminal of the first power amplifier 9a is connected to the signal processing circuit 301 via either of the two first signal input terminals 212 and 214. The two first signal input terminals 212 and 214 are terminals for inputting a radio-frequency signal (transmission signal) from an external circuit (for example, the signal processing circuit 301) to the radio-frequency module 1. One terminal, out of the two first signal input terminals 212 and 214, is a terminal for inputting a transmission signal of the 4G standard to the radio-frequency module 1 and the other out of the two first signal input terminals 212 and 214 is a terminal for inputting a transmission signal of the 5G standard to the radio-frequency module 1. The first output terminal of the first power amplifier 9a is connected to a first common terminal 71 of the second switch 7 via the first output matching network 8a. Therefore, the first output terminal of the first power amplifier 9a can be connected to the first filter 6a via the second switch 7.

Figure 2:
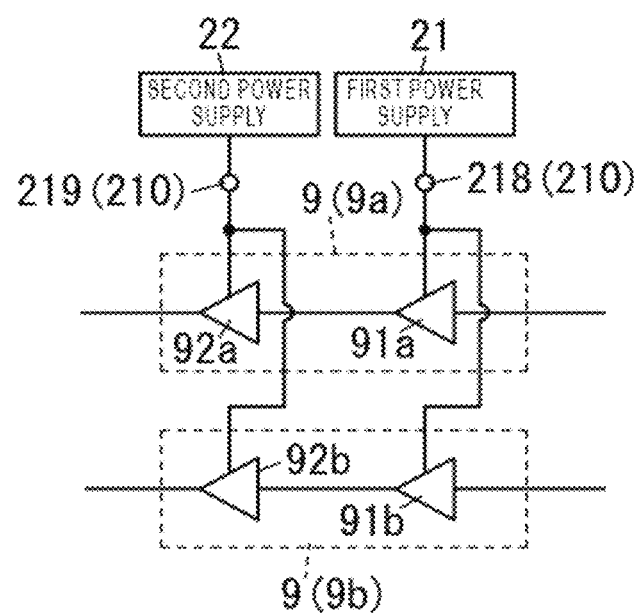
FIG. 2 is a circuit configuration diagram of main parts of the radio-frequency module according to Embodiment 1.
Figure 3:
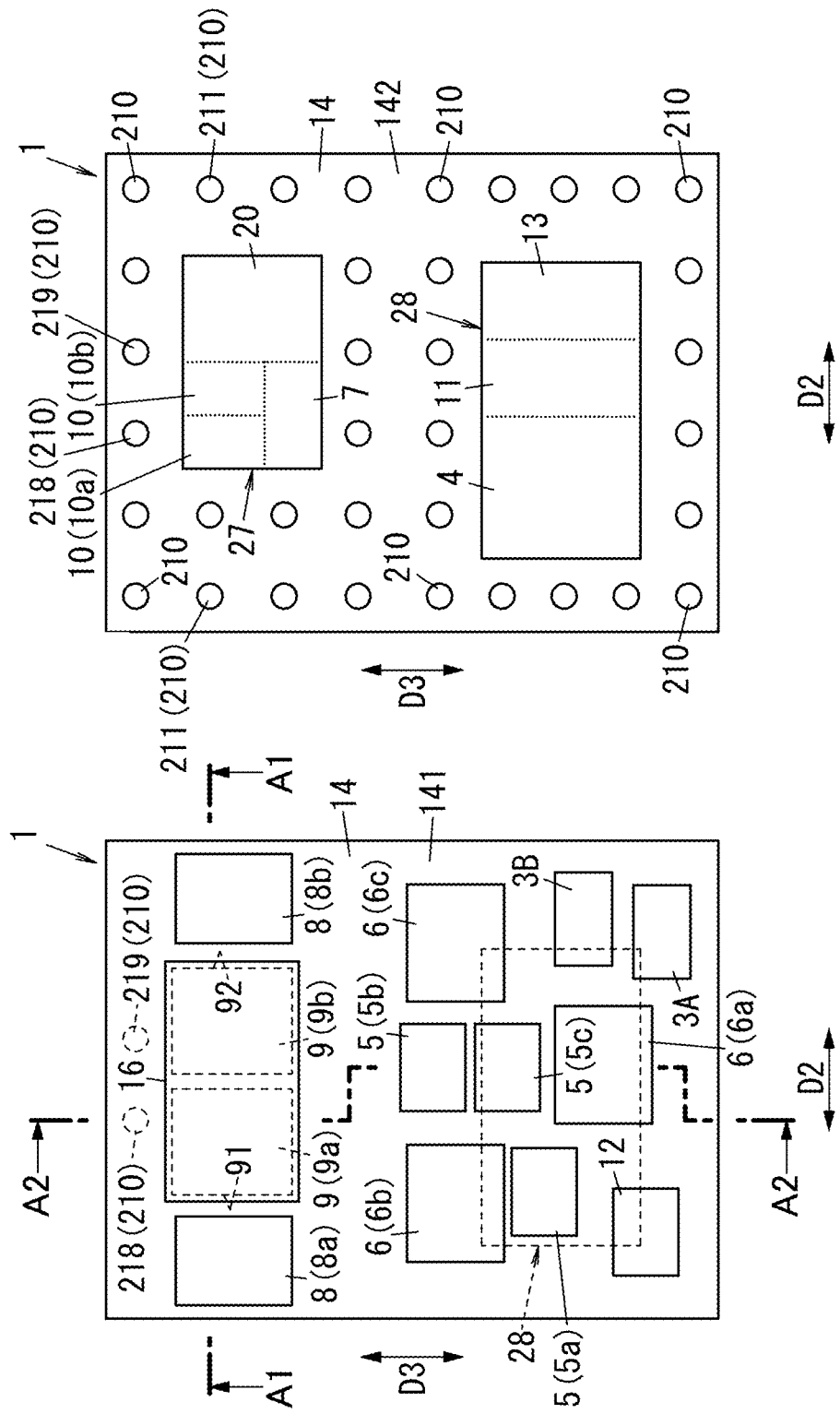
FIG. 3A is a plan view of the radio-frequency module according to Embodiment 1 in which a shield layer and a resin layer are omitted.
FIG. 3B is a plan view of the radio-frequency module according to Embodiment 1 in which a second main surface of a mounting substrate and circuit components and a plurality of external connection terminals disposed on the second main surface of the mounting substrate are viewed in a see-through manner from a first main surface side of the mounting substrate.

As illustrated in FIG. 2, the first power amplifier 9a includes a first amplifying unit 91a and a second amplifying unit 92a. The first amplifying unit 91a is, for example, a driver-stage amplifying unit. The second amplifying unit 92a is, for example, a power-stage amplifying unit. The first amplifying unit 91a and the second amplifying unit 92a, for example, each include a transistor (not illustrated). A power supply voltage is supplied to the first amplifying unit 91a from the first power supply 21 via the first power supply terminal 218. In addition, a power supply voltage is supplied to the second amplifying unit 92a from the second power supply 22 via the second power supply terminal 219. In the radio-frequency module 1 according to Embodiment 1, the first power supply 21 and the second power supply 22 are provided on the circuit substrate on which the radio-frequency module 1 is mounted. Here, in the radio-frequency module 1 according to Embodiment 1, the first power supply terminal 218 and the second power supply terminal 219 are external connection terminals. The first power supply 21 and the second power supply 22 may be in the form of one module or may be separate modules.

The second power amplifier 9b has a second input terminal and a second output terminal. The second power amplifier 9b amplifies a transmission signal of a second frequency band input to the second input terminal and outputs the amplified transmission signal from the second output terminal. The second frequency band is a frequency band located at a lower frequency than the first frequency band. In the radio-frequency module 1 according to Embodiment 1, the first frequency band is a high-band frequency band and the second frequency band is a middle-band frequency band. The second frequency band includes transmission bands of communication bands used in frequency division duplexing (FDD), for example. In more detail, the second frequency band includes a transmission band of a second communication band used in FDD and a transmission band of a third communication band used in FDD. The second communication band corresponds to a transmission signal that passes through a second transmission filter 63 of the second filter 6b and is, for example, Band 1, Band 3, Band 2, Band 25, Band 4, Band 66, Band 39 or Band 34 of the 3GPP LTE standard or n1 of 5GNR. The third communication band corresponds to a transmission signal that passes through a third transmission filter 65 of the third filter 6c and is, for example, Band 3 of the 3GPP LTE standard or n3 of 5GNR.

The second input terminal of the second power amplifier 9b is selectably connected to the two second signal input terminals 213 and 215 via the middle-band fourth switch 10b. The second input terminal of the second power amplifier 9b is connected to the signal processing circuit 301 via either of the two second signal input terminals 213 and 215. The two second signal input terminals 213 and 215 are terminals for inputting a radio-frequency signal (transmission signal) from an external circuit (for example, the signal processing circuit 301) to the radio-frequency module 1. One out of the two second signal input terminals 213 and 215 is a terminal for inputting a transmission signal of the 4G standard to the radio-frequency module 1 and the other one out of the two second signal input terminals 213 and 215 is a terminal for inputting a transmission signal of the 5G standard to the radio-frequency module 1. The second output terminal of the second power amplifier 9b is connected to a second common terminal 75 of the second switch 7 via the second output matching network 8b. Therefore, the second output terminal of the second power amplifier 9b can be connected to the second filter 6b and the third filter 6c via the second switch 7.

As illustrated in FIG. 2, the second power amplifier 9b includes a first amplifying unit 91b and a second amplifying unit 92b. The first amplifying unit 91b is, for example, a driver-stage amplifying unit. The second amplifying unit 92b is, for example, a power-stage amplifying unit. The first amplifying unit 91b and the second amplifying unit 92b, for example, each include a transistor (not illustrated). A power supply voltage is supplied to the first amplifying unit 91b from the first power supply 21 via the first power supply terminal 218. In addition, a power supply voltage is supplied to the second amplifying unit 92b from the second power supply 22 via the second power supply terminal 219. In other words, in the radio-frequency module 1 according to Embodiment 1, the first power supply terminal 218, which is an external connection terminal, is connected to the first power supply 21 and is connected to both the first power amplifier 9a and the second power amplifier 9b. In addition, in the radio-frequency module 1 according to Embodiment 1, the second power supply terminal 219, which is an external connection terminal, is connected to the second power supply 22 and is connected to both the first power amplifier 9a and the second power amplifier 9b. In the radio-frequency module 1 according to Embodiment 1, the first power supply terminal 218 is a first external connection terminal and the second power supply terminal 219 is a second external connection terminal.

The first low pass filter 3A is connected to a signal path between the first antenna terminal 2A and a first common terminal 41A of the first switch 4. The first low pass filter 3A, for example, includes a plurality of inductors and a capacitor. The first low pass filter 3A may be an integrated passive device (IPD) including a plurality of inductors and a capacitor.

The second low pass filter 3B is connected to a signal path between the second antenna terminal 2B and a second common terminal 41B of the first switch 4. The second low pass filter 3B, for example, includes a plurality of inductors and a capacitor. The second low pass filter 3B may be an integrated passive device (IPD) including a plurality of inductors and a capacitor.

The low-noise amplifier 13 has an input terminal and an output terminal. The low-noise amplifier 13 amplifies a reception signal of the first frequency band input to the input terminal and outputs the amplified reception signal from the output terminal. The input terminal of the low-noise amplifier 13 is connected to a common terminal 111 of the third switch 11 via the input matching network 12. The output terminal of the low-noise amplifier 13 is connected to the signal output terminal 217. The output terminal of the low-noise amplifier 13 is, for example, connected to the signal processing circuit 301 via the signal output terminal 217. The signal output terminal 217 is a terminal for outputting a radio-frequency signal (reception signal) from the low-noise amplifier 13 to an external circuit (for example, the signal processing circuit 301).

Each of the plurality of filters 6 (the first filter 6a, the second filter 6b, and the third filter 6c) is a duplexer, for example. The first filter 6a includes the first transmission filter 61 and a first reception filter 62. The second filter 6b includes the second transmission filter 63 and a second reception filter 64. The third filter 6c includes the third transmission filter 65 and a third reception filter 66.

The first transmission filter 61 is, for example, a band pass filter in which the pass band is the transmission band of the first communication band. The second transmission filter 63 is, for example, a band pass filter in which the pass band is the transmission band of the second communication band. The third transmission filter 65 is, for example, a band pass filter in which the pass band is the transmission band of the third communication band.

The first reception filter 62 is, for example, a band pass filter in which the pass band is the reception band of the first communication band. The second reception filter 64 is, for example, a band pass filter in which the pass band is the reception band of the second communication band. The third reception filter 66 is, for example, a band pass filter in which the pass band is the reception band of the third communication band.

The input terminal of the first transmission filter 61 is connected to a first selection terminal 72 of the second switch 7. The output terminal of the first transmission filter 61 is connected to a first selection terminal 42 of the first switch 4 via the first matching network 5a. The input terminal of the second transmission filter 63 is connected to a second selection terminal 76 of the second switch 7. The output terminal of the second transmission filter 63 is connected to a second selection terminal 43 of the first switch 4 via the second matching network 5b. The input terminal of the third transmission filter 65 is connected to a second selection terminal 77 of the second switch 7. The output terminal of the third transmission filter 65 is connected to a second selection terminal 44 of the first switch 4 via the third matching network 5c.

The input terminal of the first reception filter 62 is connected to the first selection terminal 42 of the first switch 4 via the first matching network 5a. The output terminal of the first reception filter 62 is connected to a selection terminal 112 of the third switch 11. The input terminal of the second reception filter 64 is connected to the second selection terminal 43 of the first switch 4 via the second matching network 5b. The output terminal of the second reception filter 64 is connected to a selection terminal 113 of the third switch 11. The input terminal of the third reception filter 66 is connected to the second selection terminal 44 of the first switch 4 via the third matching network 5c. The output terminal of the third reception filter 66 is connected to a selection terminal 114 of the third switch 11.

The first switch 4 has the first common terminal 41A, the second common terminal 41B, the first selection terminal 42 that can be connected to the first common terminal 41A, and a plurality of (two in the illustrated example) second selection terminals 43 and 44 that can be connected to the second common terminal 41B. The first common terminal 41A is connected to the first antenna terminal 2A via the first low pass filter 3A. The first antenna 310 is connected to the first antenna terminal 2A. The first selection terminal 42 is connected to the first matching network 5a. The second common terminal 41B is connected to the second antenna terminal 2B via the second low pass filter 3B. The second antenna 311 is connected to the second antenna terminal 2B. The second selection terminal 43, out of the plurality of second selection terminals 43 and 44, is connected to the second matching network 5b. The second selection terminal 44, out of the plurality of second selection terminals 43 and 44, is connected to the third matching network 5c. The first switch 4 is, for example, a switch that is able to connect at least one second selection terminal, out of the plurality of second selection terminals 43 and 44, to the second common terminal 41B. Here, the first switch 4 is, for example, a switch that is capable of realizing one-to-one and one-to-many connections.

The first switch 4 is, for example, a switch integrated circuit (IC). The first switch 4 is controlled by the signal processing circuit 301, for example. In this case, the first switch 4 switches a connection state between the first common terminal 41A and the first selection terminal 42 and connection states between the second common terminal 41B and the plurality of second selection terminals 43 and 44 in accordance with a control signal from the RF signal processing circuit 302 of the signal processing circuit 301. The first switch 4 may be controlled by the controller 20 instead of being controlled by the signal processing circuit 301.

The second switch 7 has the first common terminal 71, the second common terminal 75, the first selection terminal 72 that can be connected to the first common terminal 71, and the plurality of (two in the illustrated example) second selection terminals 76 and 77 that can be connected to the second common terminal 75. The first common terminal 71 is connected to the output terminal of the first power amplifier 9a via the first output matching network 8a. The first selection terminal 72 is connected to the input terminal of the first transmission filter 61. The second common terminal 75 is connected to the output terminal of the second power amplifier 9b via the second output matching network 8b. The second selection terminal 76, out of the plurality of second selection terminals 76 and 77, is connected to the input terminal of the second transmission filter 63. The second selection terminal 77, out of the plurality of second selection terminals 76 and 77, is connected to the input terminal of the third transmission filter 65. The second switch 7 is, for example, a switch that is able to connect at least one second selection terminal, out of the plurality of second selection terminals 76 and 77, to the second common terminal 75. Here, the second switch 7 is, for example, a switch that is capable of realizing one-to-one and one-to-many connections.

The second switch 7 is, for example, a switch IC. The second switch 7 is controlled by the signal processing circuit 301, for example. In this case, the second switch 7 switches a connection state between the first common terminal 71 and the first selection terminal 72 and connection states between the second common terminal 75 and the plurality of second selection terminals 76 and 77 in accordance with a control signal from the RF signal processing circuit 302 of the signal processing circuit 301. The second switch 7 may be controlled by the controller 20 instead of being controlled by the signal processing circuit 301.

The third switch 11 has the common terminal 111 and the plurality of (three in the illustrated example) selection terminals 112, 113, and 114. The common terminal 111 is connected to the input terminal of the low-noise amplifier 13 via the input matching network 12. The selection terminal 112, out of the plurality of selection terminals 112, 113, and 114, is connected to the output terminal of the first reception filter 62. The selection terminal 113, out of the plurality of selection terminals 112, 113, and 114, is connected to the output terminal of the second reception filter 64. The selection terminal 114, out of the plurality of selection terminals 112, 113, and 114, is connected to the output terminal of the third reception filter 66. The third switch 11 is, for example, a switch that is able to connect at least one selection terminal, out of the plurality of selection terminals 112, 113, and 114, to the common terminal 111. Here, the third switch 11 is, for example, a switch that is capable of realizing one-to-one and one-to-many connections.

The third switch 11 is, for example, a switch IC. The third switch 11 is controlled by the signal processing circuit 301, for example. In this case, the third switch 11 switches connection states between the common terminal 111 and the plurality of selection terminals 112, 113, and 114 in accordance with a control signal from the RF signal processing circuit 302 of the signal processing circuit 301. The third switch 11 may be controlled by the controller 20 instead of being controlled by the signal processing circuit 301.

The high-band fourth switch 10a has a common terminal 101 and a plurality of (two in the illustrated example) selection terminals 102 and 103. The common terminal 101 is connected to the input terminal of the first power amplifier 9a. The two selection terminals 102 and 103 are connected in a one-to-one manner to the two first signal input terminals 212 and 214.

The high-band fourth switch 10a is, for example, a switch IC. The high-band fourth switch 10a is, for example, controlled by the controller 20. In this case, the high-band fourth switch 10a is controlled by the controller 20 and switches the connection states between the common terminal 101 and the plurality of selection terminals 102 and 103. The high-band fourth switch 10a may instead be controlled by the signal processing circuit 301. In this case, the high-band fourth switch 10a switches connection states between the common terminal 101 and the plurality of selection terminals 102 and 103 in accordance with a control signal from the RF signal processing circuit 302 of the signal processing circuit 301.

The middle-band fourth switch 10b has a common terminal 105 and a plurality of (two in the illustrated example) selection terminals 106 and 107. The common terminal 105 is connected to the input terminal of the second power amplifier 9b. The two selection terminals 106 and 107 are connected in a one-to-one manner to the two second signal input terminals 213 and 215.

The middle-band fourth switch 10b is, for example, a switch IC. The middle band fourth switch 10b is, for example, controlled by the controller 20. In this case, the middle band fourth switch 10b is controlled by the controller 20 and switches the connection states between the common terminal 105 and the plurality of selection terminals 106 and 107. The middle band fourth switch 10b may instead be controlled by the signal processing circuit 301. In this case, the middle band fourth switch 10b switches connection states between the common terminal 105 and the plurality of selection terminals 106 and 107 in accordance with a control signal from the RF signal processing circuit 302 of the signal processing circuit 301.

The first output matching network 8a is provided on a signal path between the output terminal of the first power amplifier 9a and the first common terminal 71 of the second switch 7. The first output matching network 8a is a circuit for realizing impedance matching between the first power amplifier 9a and the first transmission filter 61. The first output matching network 8a is, for example, formed of a single inductor, but not limited to this configuration, for example, may be configured to include a plurality of inductors and a plurality of capacitors or may be configured to include a transformer.

The second output matching network 8b is provided on a signal path between the output terminal of the second power amplifier 9b and the second common terminal 75 of the second switch 7. The second output matching network 8b is a circuit for realizing impedance matching between the second power amplifier 9b and the second transmission filter 63 and the third transmission filter 65. The second output matching network 8b is, for example, formed of a single inductor, but not limited to this configuration, for example, may be configured to include a plurality of inductors and a plurality of capacitors or may be configured to include a transformer.

The input matching network 12 is provided on a signal path between the input terminal of the low-noise amplifier 13 and the common terminal 111 of the third switch 11. The input matching network 12 is a circuit for realizing impedance matching between the low-noise amplifier 13 and the first reception filter 62, the second reception filter 64, and the third reception filter 66. The input matching network 12 is, for example, formed of a single inductor, but not limited to this configuration, for example, may be configured to include a plurality of inductors and a plurality of capacitors.

The first matching network 5a is provided on a signal path between the first selection terminal 42 of the first switch 4 and a connection point between the output terminal of the first transmission filter 61 and the input terminal of the first reception filter 62. The first matching network 5a is a circuit for realizing impedance matching between the first filter 6a and the first switch 4. The first matching network 5a is, for example, formed of a single inductor, but not limited to this configuration, for example, may be configured to include a plurality of inductors and a plurality of capacitors.

The second matching network 5b is provided on a signal path between the second selection terminal 43 of the first switch 4 and a connection point between the output terminal of the second transmission filter 63 and the input terminal of the second reception filter 64. The second matching network 5b is a circuit for realizing impedance matching between the second filter 6b and the first switch 4. The second matching network 5b is, for example, formed of a single inductor, but not limited to this configuration, for example, may be configured to include a plurality of inductors and a plurality of capacitors.

The third matching network 5c is provided on a signal path between the second selection terminal 44 of the first switch 4 and a connection point between the output terminal of the third transmission filter 65 and the input terminal of the third reception filter 66. The third matching network 5c is a circuit for realizing impedance matching between the third filter 6c and the first switch 4. The third matching network 5c is, for example, formed of a single inductor, but not limited to this configuration, for example, may be configured to include a plurality of inductors and a plurality of capacitors.

The controller 20 is connected to the first power amplifier 9a and the second power amplifier 9b. In addition, the controller 20 is connected to the signal processing circuit 301 via a plurality of (for example, four) control terminals 216. In FIG. 1, only one of the four control terminals 216 is illustrated. The control terminals 216 are terminals for inputting control signals from an external circuit (for example, the signal processing circuit 301) to the controller 20. The controller 20 controls the first power amplifier 9a and the second power amplifier 9b on the basis of control signals obtained from the plurality of control terminals 216. The control terminals 216 are compatible with the mobile industry processor interface (MIPI) standard, for example. The controller 20 has a plurality of terminals, serving as input parts through which control signals are input, that are connected to the plurality of control terminals 216. The plurality of terminals are compatible with the MIPI standard, for example. The controller 20 controls the first power amplifier 9a and the second power amplifier 9b in accordance with control signals from the RF signal processing circuit 302.

The controller 20 receives control signals from the RF signal processing circuit 302 via the plurality of terminals and, for example, supplies a first bias (first bias current or first bias voltage) to the first amplifying unit 91a and the second amplifying unit 92a of the first power amplifier 9a (refer to FIG. 2) and supplies a second bias (second bias current or second bias voltage) to the first amplifying unit 91b and the second amplifying unit 92b of the second power amplifier 9b (refer to FIG. 2) in accordance with this control signal. In the radio-frequency module 1 according to Embodiment 1, the controller 20 causes only one out of the first power amplifier 9a and the second power amplifier 9b to operate. In other words, the controller 20 makes a first period in which a transmission signal is output from the first power amplifier 9a and a second period in which a transmission signal is output from the second power amplifier 9b different from each other. The controller 20 supplies the first bias to the first power amplifier 9a in the first period and supplies the second bias to the second power amplifier 9b in the second period. The control signal is not limited to being a control signal that is compatible with the MIPI standard and may instead be a control signal that is compatible with general purpose input/output (GPIO). Furthermore, the controller 20 is also connected to the first switch 4, the second switch 7, the third switch 11, and the plurality of fourth switches 10 and also controls the first switch 4, the second switch 7, the third switch 11, and the plurality of fourth switches 10 on the basis of the above-described control signals.

1.2 Structure of Radio-Frequency Module

Next, the structure of the radio-frequency module 1 according to Embodiment 1 will be described while referring to FIGS. 3A to 5. In FIG. 5, illustration of wiring lines provided inside the mounting substrate 14 is omitted.

As illustrated in FIGS. 3A to 5, the radio-frequency module 1 according to Embodiment 1 includes the mounting substrate 14, a plurality of circuit components, and the plurality of external connection terminals 210. In addition, the radio-frequency module 1 according to Embodiment 1 further includes a first resin layer 201, a second resin layer 202, and a shield layer 203.

The plurality of circuit components includes the plurality of power amplifiers 9, the plurality of low pass filters 3A and 3B, the low-noise amplifier 13, the plurality of filters 6, the plurality of output matching networks 8, the input matching network 12, and the plurality of matching networks 5 described above. Furthermore, the plurality of circuit components further includes the first switch 4, the second switch 7, the third switch 11, and the plurality of fourth switches 10 described above.

The mounting substrate 14 has the first main surface 141 and the second main surface 142, which face each other in a thickness direction D1 of the mounting substrate 14. The mounting substrate 14 is, for example, a multilayer substrate that includes a plurality of dielectric layers and a plurality of electrically conductive layers. The dielectric layers and the electrically conductive layers are stacked in the thickness direction D1 of the mounting substrate 14. The electrically conductive layers are formed in prescribed patterns determined for the respective layers. The electrically conductive layers each include one or a plurality of conductive parts within a plane that is perpendicular to the thickness direction D1 of the mounting substrate 14. The material of each electrically conductive layer is copper, for example. The plurality of electrically conductive layers includes a ground layer. In the radio-frequency module 1, the plurality of ground terminals 211 (refer to FIGS. 3B and 4) and the ground layer are electrically connected to each other by via conductors and so forth of the mounting substrate 14. The mounting substrate 14 is, for example, a low temperature co-fired ceramic (LTCC) substrate. The mounting substrate 14 is not limited to being an LTCC substrate and may be a high temperature co-fired ceramic (HTCC) substrate or a resin multilayer substrate, for example.

Furthermore, the mounting substrate 14 is not limited being an LTCC substrate and may be a wiring structure, for example. The wiring structure is a multilayer structure, for example. The multilayer structure includes at least one insulating layer and at least one electrically conductive layer. The insulating layer is formed in a prescribed pattern. When there are a plurality of insulating layers, the insulating layers are formed in prescribed patterns determined for the respective layers. The electrically conductive layers are formed in prescribed patterns that are different from the prescribed patterns of the insulating layers. When there are a plurality of electrically conductive layers, the electrically conductive layers are formed in prescribed patterns determined for the respective layers. Each electrically conductive layer may include one or a plurality of re-wiring parts. In the wiring structure, out of two surfaces that face each other in the thickness direction of the multilayer structure, a first surface is the first main surface 141 of the mounting substrate 14 and a second surface is the second main surface 142 of the mounting substrate 14. The wiring structure may be, for example, an interposer. The interposer may be an interposer using a silicon substrate or may be a substrate formed of a plurality of layers.

The first main surface 141 and the second main surface 142 of the mounting substrate 14 are separated from each other in the thickness direction D1 of the mounting substrate 14 and intersect the thickness direction D1 of the mounting substrate 14. The first main surface 141 of the mounting substrate 14 is, for example, perpendicular to the thickness direction D1 of the mounting substrate 14, but may, for example, include the side surfaces of electrically conductive parts as surfaces that are not perpendicular to the thickness direction D1. The second main surface 142 of the mounting substrate 14 is, for example, perpendicular to the thickness direction D1 of the mounting substrate 14, but may, for example, include the side surfaces of electrically conductive parts as surfaces that are not perpendicular to the thickness direction D1. In addition, minute irregularities, recesses, or protrusions may be formed on the first main surface 141 and the second main surface 142 of the mounting substrate 14. For example, in the case where recesses are formed in the first main surface 141 of the mounting substrate 14, the inner surfaces of these recesses are included in the first main surface 141. In plan view in the thickness direction D1 of the mounting substrate 14, the mounting substrate 14 has a substantially rectangular shape, but the mounting substrate 14 is not limited to having this shape and may instead have a substantially square shape, for example.

In the radio-frequency module 1 according to Embodiment 1, a plurality of circuit components are mounted on the first main surface 141 or the second main surface 142 of the mounting substrate 14. In the present disclosure, the meaning of "circuit components are mounted on the first main surface 141 or the second main surface 142 of the mounting substrate 14" includes the case where circuit components are disposed on the first main surface 141 or the second main surface 142 of the mounting substrate 14 (mechanically connected) and the case where circuit components are electrically connected to (appropriate electrically conductive parts of) the mounting substrate 14. Therefore, in the radio-frequency module 1, a plurality of circuit components are disposed on the first main surface 141 or the second main surface 142 of the mounting substrate 14. Note that the radio-frequency module 1 is not limited to only including a plurality of circuit components mounted on the mounting substrate 14 and may also include circuit elements provided inside the mounting substrate 14.

In the radio-frequency module 1 according to Embodiment 1, the plurality of power amplifiers 9 and the plurality of output matching networks 8 are mounted on the first main surface 141 of the mounting substrate 14. In addition, in the radio-frequency module 1 according to Embodiment 1, the plurality of low pass filters 3A and 3B, the plurality of matching networks 5, the plurality of filters 6, and the input matching network 12 are mounted on the first main surface 141 of the mounting substrate 14.

Furthermore, in the radio-frequency module 1 according to Embodiment 1, an IC chip 27, which is a single chip that includes the second switch 7, the plurality of fourth switches 10, and the controller 20, is mounted on the second main surface 142 of the mounting substrate 14. In addition, in the radio-frequency module 1 according to Embodiment 1, an IC chip 28, which is a single chip that includes the first switch 4, the third switch 11, and the low-noise amplifier 13, is mounted on the second main surface 142 of the mounting substrate 14.

The first power amplifier 9a is an IC chip that includes a circuit section including the first amplifying unit 91a and the second amplifying unit 92a. The first power amplifier 9a is flip chip mounted on the first main surface 141 of the mounting substrate 14. The first power amplifier 9a has a substantially quadrangular outer peripheral shape in plan view in the thickness direction D1 of the mounting substrate 14. The transistors forming the first amplifying unit 91a and the second amplifying unit 92a are heterojunction bipolar transistors (HBTs), for example. In this case, the IC chip forming the first power amplifier 9a is, for example, a GaAs IC chip. The transistors forming the first amplifying unit 91a and the second amplifying unit 92a are not limited to being bipolar transistors such as HBTs and may instead be field effect transistors (FETs), for example. The FETs are, for example, metal-oxide semiconductor field effect transistors (MOSFETs). The IC chip forming the first power amplifier 9a is not limited to being a GaAs IC chip and, for example, may instead be a Si IC chip, a SiGe IC chip, or a GaN IC chip.

The second power amplifier 9b is an IC chip that includes a circuit section including the first amplifying unit 91b and the second amplifying unit 92b. The second power amplifier 9b is flip chip mounted on the first main surface 141 of the mounting substrate 14. The second power amplifier 9b has a substantially quadrangular outer peripheral shape in plan view in the thickness direction D1 of the mounting substrate 14. The transistors forming the first amplifying unit 91b and the second amplifying unit 92b are, for example, HBTs. In this case, the IC chip forming the second power amplifier 9b is a GaAs IC chip, for example. The transistors forming the first amplifying unit 91b and the second amplifying unit 92b are not limited to being bipolar transistors such as HBTs and may instead be FETs, for example. The FETs are MOSFETs, for example. The IC chip forming the second power amplifier 9b is not limited to being a GaAs IC chip and, for example, may instead be a Si IC chip, a SiGe IC chip, or a GaN IC chip.

Figure 4:
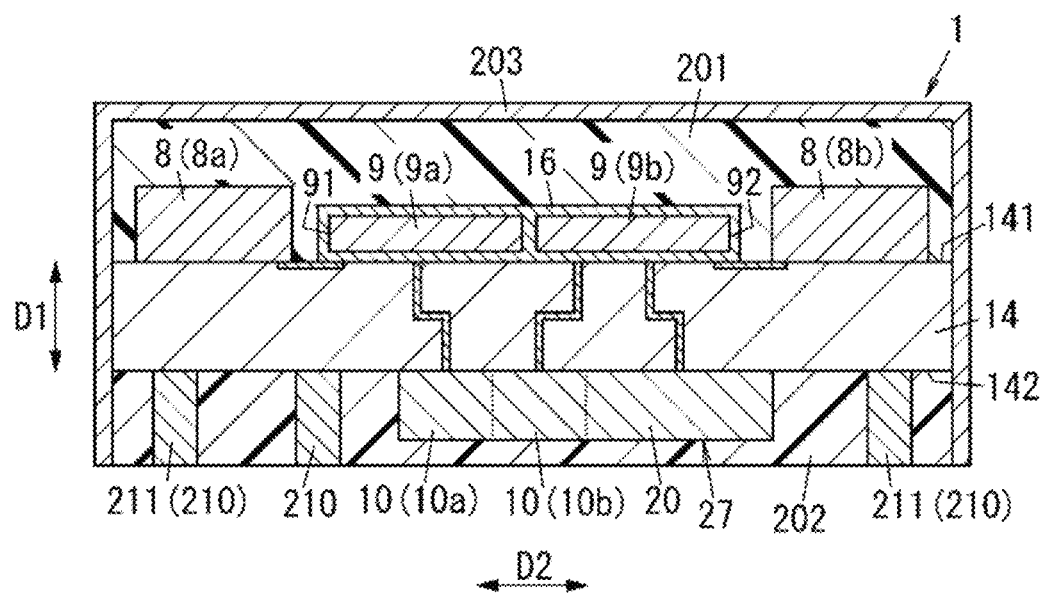
FIG. 4 is a sectional view of the radio-frequency module according to Embodiment 1 taken along line A1-A1 in FIG. 3A.
Figure 5:
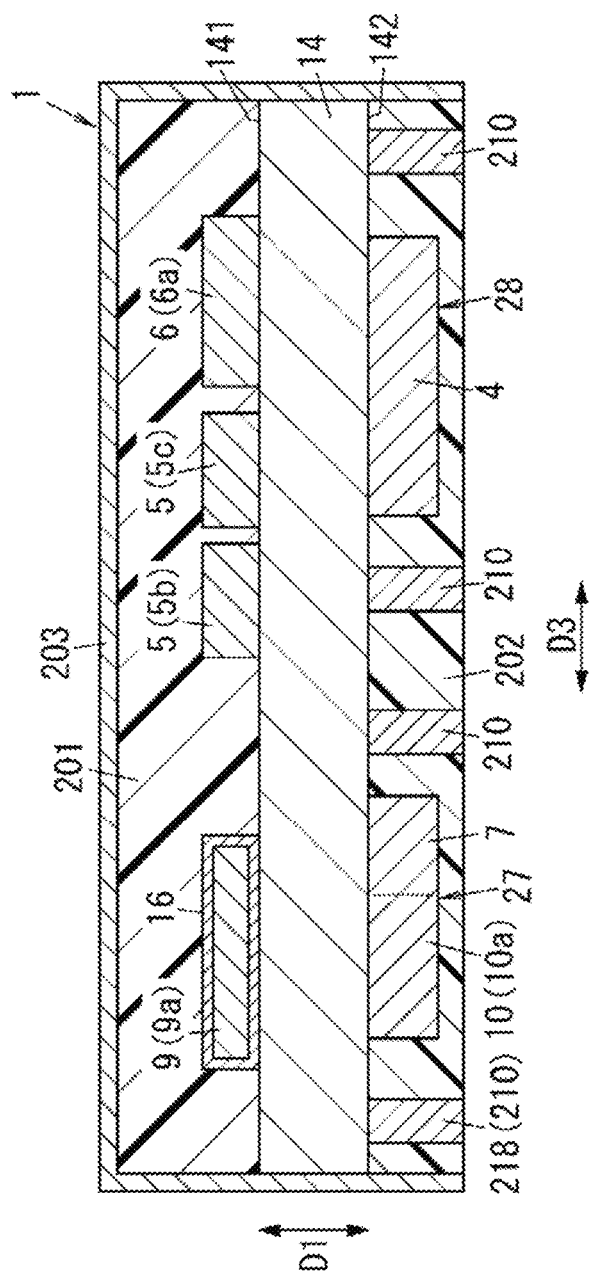
FIG. 5 is a sectional view of the radio-frequency module according to Embodiment 1 taken along line A2-A2 in FIG. 3A.

Here, as illustrated in FIGS. 3A, 4, and 5, in the radio-frequency module 1 according to Embodiment 1, the first power amplifier 9a and the second power amplifier 9b are housed inside a single package 16. In other words, the radio-frequency module 1 according to Embodiment 1 further includes the package 16 that houses the first power amplifier 9a and the second power amplifier 9b. In the radio-frequency module 1 according to Embodiment 1, the first power amplifier 9a and the second power amplifier 9b are mounted on the first main surface 141 of the mounting substrate 14 by mounting the package 16 on the first main surface 141 of the mounting substrate 14. Thus, in the radio-frequency module 1 according to Embodiment 1, it is possible to reduce the area of the first main surface 141 in plan view in the thickness direction D1 of the mounting substrate 14 compared with a case where the first power amplifier 9a and the second power amplifier 9b are separately connected to the mounting substrate 14 using wire bonding. Here, it is preferable that part of the package 16 on the opposite side from the mounting substrate 14 be formed of a material having a high heat dissipation property taking into consideration the heat dissipation properties of the first power amplifier 9a and the second power amplifier 9b.

The first transmission filter 61 and the first reception filter 62 of the first filter 6a are ladder filters, for example. In addition, the second transmission filter 63 and the second reception filter 64 of the second filter 6b are ladder filters, for example. Furthermore, the third transmission filter 65 and the third reception filter 66 of the third filter 6c are ladder filters, for example. The first transmission filter 61 and the first reception filter 62 each include a plurality of (for example, four) series arm resonators and a plurality of (for example, three) parallel arm resonators. In addition, the second transmission filter 63 and the second reception filter 64 each include a plurality of (for example, four) series arm resonators and a plurality of (for example, three) parallel arm resonators. Furthermore, the third transmission filter 65 and the third reception filter 66 each include a plurality of (for example, four) series arm resonators and a plurality of (for example, three) parallel arm resonators.

The first transmission filter 61 and the first reception filter 62 are acoustic wave filters, for example. In addition, the second transmission filter 63 and the second reception filter 64 are acoustic wave filters, for example. Furthermore, the third transmission filter 65 and the third reception filter 66 are acoustic wave filters, for example. The plurality of series arm resonators and a plurality of parallel arm resonators forming each acoustic wave filter each consist of acoustic wave resonators. The acoustic wave filters are, for example, surface acoustic wave filters that utilize surface acoustic waves.

The plurality of series arm resonators and the plurality of parallel arm resonators of each surface acoustic wave filter are surface acoustic wave (SAW) resonators, for example.

Each surface acoustic wave filter, for example, includes a piezoelectric property substrate, a plurality of interdigital transducer (IDT) electrodes formed on the piezoelectric property substrate and having a one-to-one correspondence with the plurality of series arm resonators and a plurality of IDT electrodes formed on the piezoelectric property substrate and having a one-to-one correspondence with the plurality of parallel arm resonators. The piezoelectric property substrate is, for example, a piezoelectric substrate. The piezoelectric substrate is, for example, a lithium niobate substrate, a lithium tantalate substrate, or a quartz substrate. The piezoelectric property substrate is not limited to being a piezoelectric substrate and may be, for example, a multilayer substrate that includes a silicon substrate, a high-acoustic-velocity film provided on the silicon substrate, a low-acoustic-velocity film provided on the high-acoustic-velocity film, and a piezoelectric layer provided on the low-acoustic-velocity film. In the multilayer substrate, the material of the piezoelectric layer is, for example, lithium niobate or lithium tantalate. The low-acoustic-velocity film is a film in which the acoustic velocity of a bulk wave propagating through the low-acoustic-velocity film is lower than the acoustic velocity of a bulk wave propagating through the piezoelectric layer. The material of the low-acoustic-velocity film is, for example, silicon oxide. The high-acoustic-velocity film is a film in which the acoustic velocity of a bulk wave propagating through the high-acoustic-velocity film is higher than the acoustic velocity of an acoustic wave propagating through the piezoelectric layer. The material of the high-acoustic-velocity film is, for example, silicon nitride.

The first filter 6a, the second filter 6b, and the third filter 6c each have a substantially quadrangular outer peripheral shape in plan view in the thickness direction D1 of the mounting substrate 14. The first filter 6a, the second filter 6b, and the third filter 6c are mounted on the first main surface 141 of the mounting substrate 14.

A circuit component (inductor) of the first output matching network 8a is, for example, a chip inductor. The circuit component of the first output matching network 8a is, for example, mounted on the first main surface 141 of the mounting substrate 14. The circuit component of the first output matching network 8a has a substantially quadrangular outer peripheral shape in plan view in the thickness direction D1 of the mounting substrate 14. The first output matching network 8a may include an inner layer inductor provided inside the mounting substrate 14.

A circuit component (inductor) of the second output matching network 8b is, for example, a chip inductor. The circuit component of the second output matching network 8b is, for example, mounted on the first main surface 141 of the mounting substrate 14. The circuit component of the second output matching network 8b has a substantially quadrangular outer peripheral shape in plan view in the thickness direction D1 of the mounting substrate 14. The second output matching network 8b may include an inner layer inductor provided inside the mounting substrate 14.

The circuit components (inductors) of the first matching network 5a, the second matching network 5b, and the third matching network 5c are chip inductors, for example. The circuit components of the first matching network 5a, the second matching network 5b, and the third matching network 5c are, for example, mounted on the first main surface 141 of the mounting substrate 14. The circuit components of the first matching network 5a, the second matching network 5b, and the third matching network 5c have substantially quadrangular outer peripheral shapes in plan view in the thickness direction D1 of the mounting substrate 14. The first matching network 5a, the second matching network 5b, and the third matching network 5c may include inner layer inductors provided inside the mounting substrate 14.

The cutoff frequency of the first low pass filter 3A is higher than the upper limit of the first frequency band. The cutoff frequency of the second low pass filter 3B is higher than the upper limit of the second frequency band. The first low pass filter 3A and the second low pass filter 3B are mounted on the first main surface 141 of the mounting substrate 14.

In the radio-frequency module 1 according to Embodiment 1, the IC chip 27, which includes the second switch 7, the controller 20, and the plurality of fourth switches 10, is mounted on the second main surface 142 of the mounting substrate 14. The IC chip 27 has a substantially quadrangular outer peripheral shape in plan view in the thickness direction D1 of the mounting substrate 14. The IC chip 27 is a Si IC chip but does not have to be a Si IC chip.

In addition, in the radio-frequency module 1 according to Embodiment 1, the IC chip 28, which includes the low-noise amplifier 13, the first switch 4, and the third switch 11, is mounted on the second main surface 142 of the mounting substrate 14. The IC chip 28 has a substantially quadrangular outer peripheral shape in plan view in the thickness direction D1 of the mounting substrate 14. An amplification transistor of the low-noise amplifier 13 is a field-effect transistor, but is not limited to being a field-effect transistor, and may instead be a bipolar transistor, for example. The IC chip 28 is a Si IC chip but does not have to be a Si IC chip.

The external connection terminals 210 are disposed on the second main surface 142 of the mounting substrate 14. The meaning of "the external connection terminals 210 are disposed on the second main surface 142 of the mounting substrate 14" includes the case where the external connection terminals 210 are mechanically connected to the second main surface 142 of the mounting substrate 14 and the case where the external connection terminals 210 are electrically connected to (appropriate electrically conductive parts of) the mounting substrate 14. The material of the external connection terminals 210 is, for example, a metal (for example, copper, a copper alloy, and so forth). The external connection terminals 210 are columnar electrodes. The columnar electrodes are, for example, electrodes having a substantially cylindrical shape. The external connection terminals 210 are bonded to electrically conductive parts of the mounting substrate 14 using, for example, solder, but not limited to solder, for example, the external connection terminals 210 may be bonded using an electrically conductive adhesive (for example, an electrically conductive paste) or may be directly bonded.

The plurality of external connection terminals 210 includes the plurality of ground terminals 211 in addition to the first antenna terminal 2A, the second antenna terminal 2B, the two first signal input terminals 212 and 214, the two second signal input terminals 213 and 215, the four control terminals 216, and the signal output terminal 217 described above. As described above, the plurality of ground terminals 211 are electrically connected to a ground layer of the mounting substrate 14. The ground layer is a circuit ground of the radio-frequency module 1. The plurality of circuit components includes circuit components that are electrically connected to the ground layer. Furthermore, the plurality of external connection terminals 210 further includes the first power supply terminal 218 and the second power supply terminal 219.

On the first main surface 141 side of the mounting substrate 14, the first resin layer 201 covers the plurality of circuit components mounted on the first main surface 141 of the mounting substrate 14. The first resin layer 201 includes a resin (for example, epoxy resin). The first resin layer 201 may include a filler in addition to the resin.

On the second main surface 142 side of the mounting substrate 14, the second resin layer 202 covers the plurality of circuit components mounted on the second main surface 142 of the mounting substrate 14 and covers the outer peripheral surfaces of the plurality of external connection terminals 210. The second resin layer 202 includes a resin (for example, epoxy resin). The second resin layer 202 may include a filler in addition to the resin. The material of the second resin layer 202 may be the same material as the first resin layer 201 or may be a different material.

The second resin layer 202 may be formed so that the main surfaces, on the opposite side from the mounting substrate 14, of the plurality of circuit components mounted on the second main surface 142 of the mounting substrate 14 are exposed from the second resin layer 202.

The shield layer 203 has electrical conductivity. The shield layer 203 has a multilayer structure in which a plurality of metal layers are stacked, but the shield layer 203 is not limited to having a multilayer structure and may instead consist of one metal layer. The metal layers include one metal or a plurality of different metals. The shield layer 203 covers the main surface, which is on the opposite side from the mounting substrate 14, of the first resin layer 201, the outer peripheral surface of the first resin layer 201, the outer peripheral surface of the mounting substrate 14, and the outer peripheral surface of the second resin layer 202. The shield layer 203 contacts the ground layer of the mounting substrate 14. This enables the potential of the shield layer 203 to be kept at the same potential as the ground layer.

1.3 Layout of Radio-Frequency Module

As illustrated in FIG. 3A, in the radio-frequency module 1, the first power amplifier 9a and the second power amplifier 9b are adjacent to each other in plan view in the thickness direction D1 of the mounting substrate 14. In the present disclosure, "the first power amplifier 9a and the second power amplifier 9b are adjacent to each other" means that the first power amplifier 9a and the second power amplifier 9b are adjacent to each other without any other circuit components interposed between the first power amplifier 9a and the second power amplifier 9b in plan view in the thickness direction D1 of the mounting substrate 14.

In addition, in the radio-frequency module 1, as illustrated in FIG. 3A, the first output matching network 8a is located on the opposite side of the first power amplifier 9a from the second power amplifier 9b. Furthermore, in the radio-frequency module 1, the second output matching network 8b is located on the opposite side of the second power amplifier 9b from the first power amplifier 9a. In the radio-frequency module 1, the first output matching network 8a, the first power amplifier 9a, the second power amplifier 9b, and the second output matching network 8b are arrayed in the order of the first output matching network 8a, the first power amplifier 9a, the second power amplifier 9b, and the second output matching network 8b in the direction in which the first power amplifier 9a and the second power amplifier 9b are arrayed (hereafter, referred to as "second direction D2").

In the radio-frequency module 1, as illustrated in FIG. 4, the high-band fourth switch 10a overlaps the first power amplifier 9a in plan view in the thickness direction D1 of the mounting substrate 14. The entire high-band fourth switch 10a overlaps part of the first power amplifier 9a in plan view in the thickness direction D1 of the mounting substrate 14 in FIG. 4, but not limited to this arrangement, part of the high-band fourth switch 10a may instead overlap part of the first power amplifier 9a. Furthermore, the entire high-band fourth switch 10a may overlap the entire first power amplifier 9a or part of the high-band fourth switch 10a may overlap the entire first power amplifier 9a.

In addition, in the radio-frequency module 1, as illustrated in FIG. 4, the middle band fourth switch 10b overlaps the second power amplifier 9b in plan view in the thickness direction D1 of the mounting substrate 14. Part of the middle band fourth switch 10b overlaps part of the second power amplifier 9b in plan view in the thickness direction D1 of the mounting substrate 14 in FIG. 4, but not limited to this arrangement, the entire middle band fourth switch 10b may instead overlap part of the second power amplifier 9b. In addition, the entire middle band fourth switch 10b may overlap the entire second power amplifier 9b or part of the middle band fourth switch 10b may overlap the entire second power amplifier 9b.

In addition, as illustrated in FIGS. 3A and 3B, in the radio-frequency module 1, the first power amplifier 9a and the second power amplifier 9b do not overlap the low-noise amplifier 13 in plan view in the thickness direction D1 of the mounting substrate 14.

Furthermore, in the radio-frequency module 1, the first power supply terminal 218, which is connected to the first power supply 21 that supplies a power supply voltage to the first amplifying unit 91a of the first power amplifier 9a and the first amplifying unit 91b of the second power amplifier 9b, and the second power supply terminal 219, which is connected to the second power supply 22 that supplies a power supply voltage to the second amplifying unit 92a of the first power amplifier 9a and the second amplifying unit 92b of the second power amplifier 9b, are arrayed along the second direction D2 in plan view in the thickness direction D1 of the mounting substrate 14 as illustrated in FIGS. 3A and 3B. Furthermore, in the radio-frequency module 1, the first power supply terminal 218 and the second power supply terminal 219 are disposed between an outer peripheral surface 91, which is on the opposite side from second power amplifier 9b, of the first power amplifier 9a and an outer peripheral surface 92, which is on the opposite side from the first power amplifier 9a, of the second power amplifier 9b in plan view in a third direction D3, which intersects both the thickness direction D1 and the second direction D2 of the mounting substrate 14. Furthermore, as illustrated in FIGS. 3A and 3B, in the radio-frequency module 1, the first power supply terminal 218 and the second power supply terminal 219 are closer to the first power amplifier 9a and the second power amplifier 9b than to the IC chip 28 in plan view in the thickness direction D1 of the mounting substrate 14. In other words, in the radio-frequency module 1, the distances from the first power supply terminal 218 and the second power supply terminal 219 to the first power amplifier 9a and the second power amplifier 9b are smaller than the distances from the first power supply terminal 218 and the second power supply terminal 219 to the IC chip 28. Furthermore, as illustrated in FIG. 3A, in the radio-frequency module 1, the first power supply terminal 218 and the second power supply terminal 219 do not overlap the first power amplifier 9a or the second power amplifier 9b in plan view in the thickness direction D1 of the mounting substrate 14.

Here, the circuit configuration of the radio-frequency module 1 includes a transmission circuit that transmits a transmission signal and a reception circuit that receives a reception signal. In the radio-frequency module 1, out of the plurality of circuit components, the circuit components included in only the transmission circuit and the rest of the circuit components (circuit components included in only the reception circuit and circuit components shared by the transmission circuit and the reception circuit) do not overlap in the thickness direction D1 of the mounting substrate 14. Out of the plurality of circuit components, the group of circuit components included in only the transmission circuit includes the first power amplifier 9a, the second power amplifier 9b, the first output matching network 8a, the second output matching network 8b, the second switch 7, the plurality of fourth switches 10, and the controller 20. Out of the plurality of circuit components, the group of circuit components included in only the reception circuit includes the third switch 11, the input matching network 12, and the low-noise amplifier 13. The group of circuit components shared by the transmission circuit and the reception circuit includes the plurality of filters 6, the plurality of matching networks 5, the first switch 4, and the plurality of low pass filters 3A and 3B.

In plan view in the thickness direction D1 of the mounting substrate 14, the radio-frequency module 1 is divided into a first region in which the group of circuit components included in only the transmission circuit, out of the plurality of circuit components, is disposed and a second region in which the group of circuit components included in only the reception circuit and the group of circuit components shared by the transmission circuit and the reception circuit, out of the plurality of circuit components, are disposed.

2 Effects 2.1 Radio-Frequency Module

The radio-frequency module 1 according to Embodiment 1 includes the mounting substrate 14, the first power amplifier 9a, the second power amplifier 9b, circuit components (for example, the IC chip 28), and the external connection terminals (the first power supply terminal 218 and the second power supply terminal 219). The mounting substrate 14 has the first main surface 141 and the second main surface 142, which face each other. The first power amplifier 9a is mounted on the first main surface 141 of the mounting substrate 14. The second power amplifier 9b is mounted on the first main surface 141 of the mounting substrate 14. The circuit component is mounted on the second main surface 142 of the mounting substrate 14. The external connection terminals are disposed on the second main surface 142 of the mounting substrate 14. The external connection terminals are connected to power supplies (first power supply 21 and second power supply 22) that supply power supply voltages to the first power amplifier 9a and the second power amplifier 9b. The external connection terminals are connected to both the first power amplifier 9a and the second power amplifier 9b.

As described above, in the radio-frequency module 1 according to Embodiment 1, the external connection terminals are connected to both the first power amplifier 9a and the second power amplifier 9b. Therefore, it is possible to reduce the area of the first main surface 141 of the mounting substrate 14 in plan view in the thickness direction D1 of the mounting substrate 14 compared with a case where the external connection terminals are separately provided for each of the first power amplifier 9a and the second power amplifier 9b. This enables the mounting substrate 14 to be reduced in size in the radio-frequency module 1 according to Embodiment 1, and as a result, the radio-frequency module 1 can be reduced in size.

Furthermore, in the radio-frequency module 1 according to Embodiment 1, the external connection terminals are closer to the first power amplifier 9a and the second power amplifier 9b than to the IC chip 28 in plan view in the thickness direction D1 of the mounting substrate 14. This enables the wiring line lengths from the external connection terminals to the first power amplifier 9a and the second power amplifier 9b to be reduced.

Furthermore, in the radio-frequency module 1 according to Embodiment 1, the external connection terminals are disposed between the outer peripheral surface 91, which is on the opposite side from the second power amplifier 9b, of the first power amplifier 9a and the outer peripheral surface 92, which is on the opposite side from the first power amplifier 9a, of the second power amplifier 9b in plan view in the third direction D3. Thus, in the radio-frequency module 1 according to Embodiment 1, the wiring line lengths from the external connection terminals to the first power amplifier 9a and the second power amplifier 9b can be reduced, and as a result, oscillations can be suppressed and infiltration of noise can be reduced.

Furthermore, in the radio-frequency module 1 according to Embodiment 1, the external connection terminals do not overlap the first power amplifier 9a or the second power amplifier 9b in plan view in the thickness direction D1 of the mounting substrate 14. Thus, in the radio-frequency module 1 according to Embodiment 1, thermal vias (heat dissipating vias) can be disposed directly below the first power amplifier 9a and the second power amplifier 9b and as a result, a heat dissipation property can be improved.

Although the first power amplifier 9a and the second power amplifier 9b are housed inside the package 16 in the radio-frequency module 1 according to Embodiment 1, the first power amplifier 9a and the second power amplifier 9b may instead be provided separate from each other.

In Embodiment 1, the radio-frequency module 1 is configured so as to perform simultaneous communication using the two antennas 310 and 311, but the embodiment is not limited to this configuration. The radio-frequency module 1 may instead be configured so as to perform simultaneous communication using one antenna.

2.2 Communication Device

The communication device 300 according to Embodiment 1 includes the above-described radio-frequency module 1 and the signal processing circuit 301. The signal processing circuit 301 is connected to the radio-frequency module 1.

Since the communication device 300 according to Embodiment 1 includes the radio-frequency module 1, the mounting substrate can be reduced in size.

The plurality of circuit components forming the signal processing circuit 301 may be, for example, mounted on the above-described circuit substrate or may be mounted on a separate circuit substrate (second circuit substrate) from the circuit substrate on which the radio-frequency module 1 is mounted (first circuit substrate).

3 Modifications 3.1 Modification 1

Figure 6:
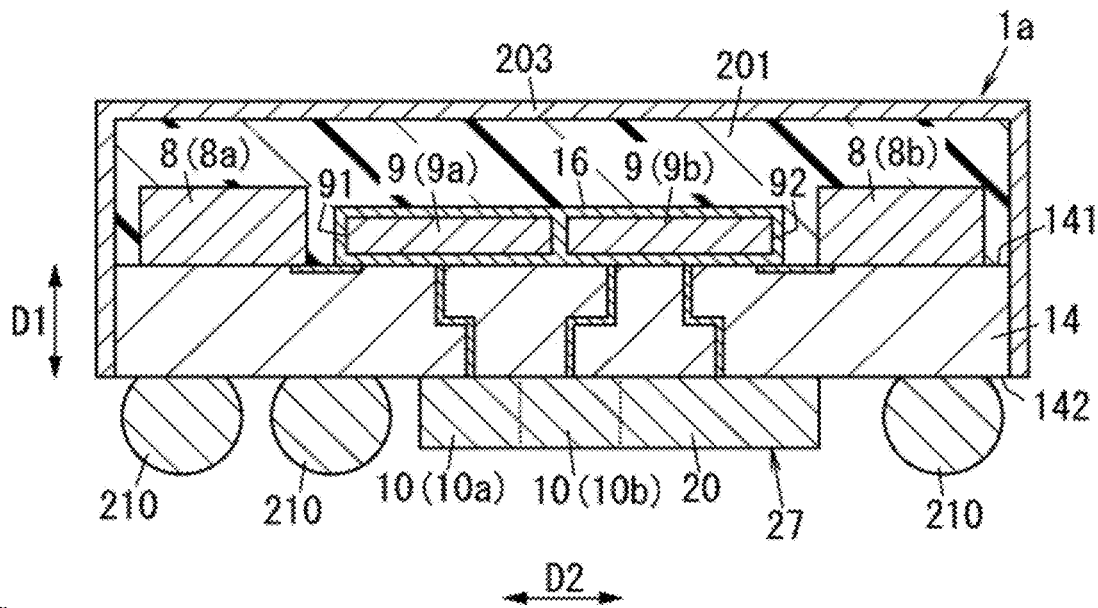
FIG. 6 is a sectional view of a radio-frequency module according to Modification 1 of Embodiment 1.

A radio-frequency module 1a according to Modification 1 of Embodiment 1 will be described while referring to FIG. 6. Constituent elements of the radio-frequency module 1a according to Modification 1 that are identical to those of the radio-frequency module 1 according to Embodiment 1 are denoted by the same symbols and description thereof is omitted. The circuit configuration of the radio-frequency module 1a is the same as the circuit configuration of the radio-frequency module 1 according to Embodiment 1 described with reference to FIG. 1.

The radio-frequency module 1a according to Modification 1 differs from the radio-frequency module 1 according to Embodiment 1 in that the plurality of external connection terminals 210 are ball bumps. In addition, the radio-frequency module 1a according to Modification 1 differs from the radio-frequency module 1 according to Embodiment 1 in that the radio-frequency module 1a does not include the second resin layer 202 of the radio-frequency module 1 according to Embodiment 1. The radio-frequency module 1a according to Modification 1 may include an underfill part provided in a gap between the circuit components (IC chip 27 and IC chip 28) mounted on the second main surface 142 of the mounting substrate 14 and the second main surface 142 of the mounting substrate 14.

The material of the ball bumps forming the plurality of external connection terminals 210 is, for example, gold, copper, solder, or the like.

The plurality of external connection terminals 210 may have a mixture of external connection terminals 210 formed of ball bumps and external connection terminals 210 formed of columnar electrodes.

Embodiment 2

Figure 7:
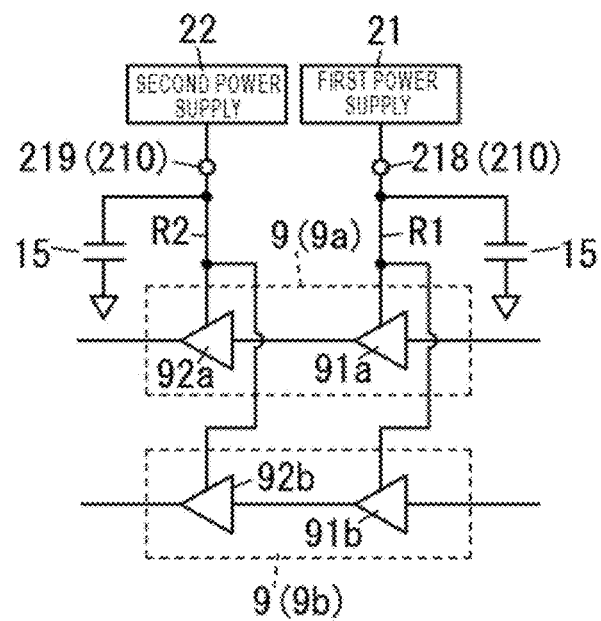
FIG. 7 is a circuit configuration diagram of main parts of a radio-frequency module according to Embodiment 2.

Next, a radio-frequency module 1b according to Embodiment 2 will be described while referring to FIGS. 7, 8A, and 8B. Constituent elements of the radio-frequency module 1b according to Embodiment 2 that are identical to those of the radio-frequency module 1 according to Embodiment 1 are denoted by the same symbols and description thereof is omitted.

The radio-frequency module 1b according to Embodiment 2 differs from the radio-frequency module 1 according to Embodiment 1 in that the radio-frequency module 1b further includes a plurality of (two in the illustrated example) capacitive elements 15. One of the capacitive elements 15 among the plurality of capacitive elements 15 is connected between ground and a path R1 connecting the first power supply terminal 218 and the first amplifying units 91a and 91b. In addition, the other capacitive element 15 among the plurality of capacitive elements 15 is connected between ground and a path R2 connecting the second power supply terminal 219 and the second amplifying units 92a and 92b. In other words, the radio-frequency module 1b according to Embodiment 2 further includes capacitive elements 15 that are connected between ground and the paths R1 and R2 connecting the external connection terminals (first power supply terminal 218 and second power supply terminal 219) and the first power amplifier 9a and the second power amplifier 9b to each other. The plurality of capacitive elements 15 may each be a capacitor, for example. The plurality of capacitive elements 15 function as bypass capacitors that cause radio-frequency noise generated along the paths R1 and R2 to be bypassed to ground.

Figure 8A:
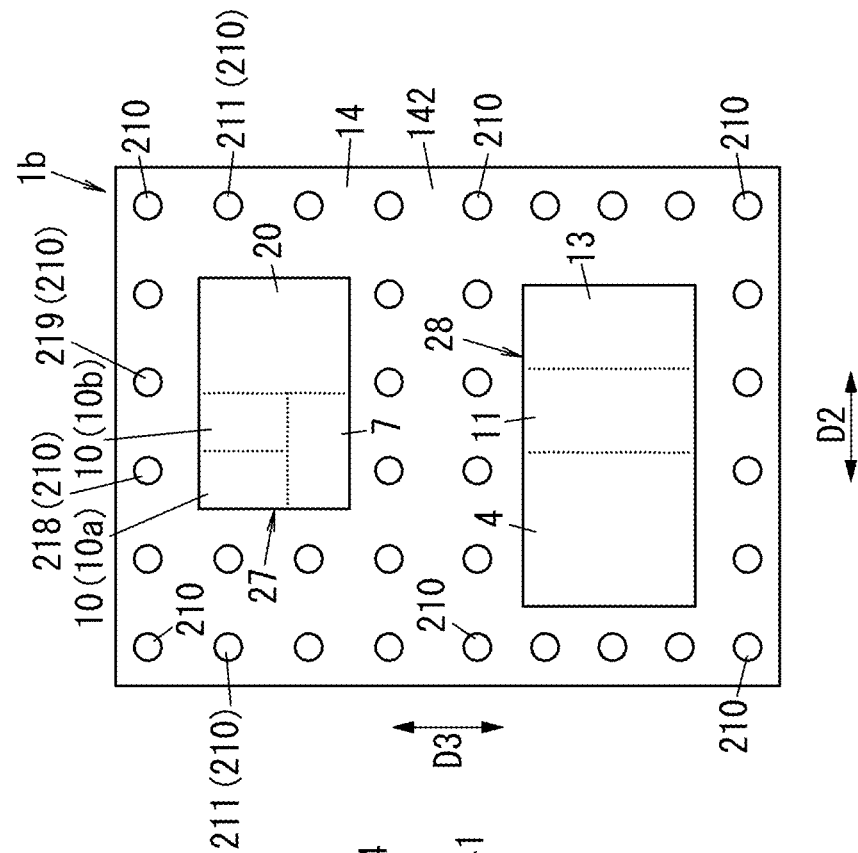
FIG. 8A is a plan view of the radio-frequency module according to Embodiment 2 in which a shield layer and a resin layer are omitted.
Figure 8B:
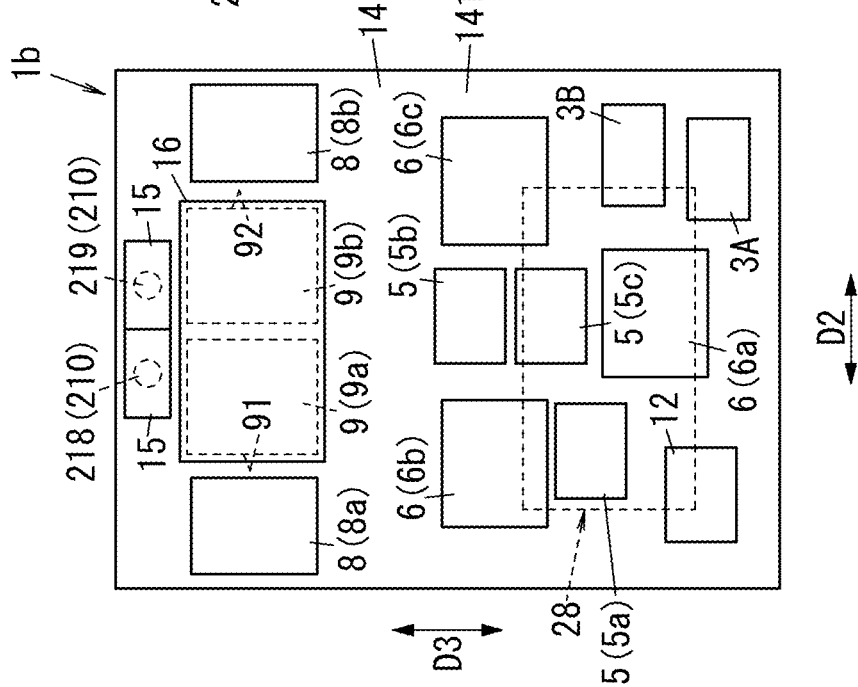
FIG. 8B is a plan view of the radio-frequency module according to Embodiment 2 in which a second main surface of a mounting substrate and circuit components and a plurality of external connection terminals disposed on the second main surface of the mounting substrate are viewed in a see-through manner from a first main surface side of the mounting substrate.

Here, in the radio-frequency module 1b according to Embodiment 2, as illustrated in FIGS. 8A and 8B, the first power supply terminal 218 and the second power supply terminal 219 overlap the capacitive elements 15 in plan view in the thickness direction D1 of the mounting substrate 14. Thus, in the radio-frequency module 1b according to Embodiment 2, the wiring line lengths between the first power supply terminal 218 and the second power supply terminal 219 and the capacitive elements 15 can be reduced. In FIGS. 8A and 8B, although the entire first power supply terminal 218 and the entire second power supply terminal 219 overlap parts of the capacitive elements 15, for example, part of the first power supply terminal 218 and part of the second power supply terminal 219 may overlap parts of the capacitive elements 15.

Aspects

The following aspects are disclosed in the present specification.

A radio-frequency module (1; 1a; 1b) according to a first aspect includes a mounting substrate (14), a first power amplifier (9a), a second power amplifier (9b), a circuit component (for example, IC chip 28), and an external connection terminal (218, 219). The mounting substrate (14) has a first main surface (141) and a second main surface (142), which face each other. The first power amplifier (9a) is mounted on the first main surface (141) of the mounting substrate (14). The second power amplifier (9b) is mounted on the first main surface (141) of the mounting substrate (14). The circuit component is a circuit component that is different from the first power amplifier (9a) and the second power amplifier (9b) and is mounted on the second main surface (142) of the mounting substrate (14). The external connection terminal (218, 219) is disposed on the second main surface (142) of the mounting substrate (14). The external connection terminal (218, 219) is connected to a power supply (21, 22) that supplies a power supply voltage to the first power amplifier (9a) and the second power amplifier (9b). The external connection terminal (218, 219) is connected to both the first power amplifier (9a) and the second power amplifier (9b).

According to this aspect, it is possible to reduce the surface area of the mounting substrate (14) in plan view in a thickness direction (D1) of the mounting substrate (14) compared with a case where the external connection terminal is provided for each of the first power amplifier (9a) and the second power amplifier (9b). In other words, according to this aspect, the mounting substrate (14) can be reduced in size.

A radio-frequency module (1; 1a; 1b) according to a second aspect based on the first aspect further includes an antenna terminal (2A, 2B). The circuit component is an IC chip (28) including a switch (4), which is connected to the antenna terminal (2A, 2B), and a low-noise amplifier (13). The external connection terminal (218, 219) is closer to the first power amplifier (9a) and the second power amplifier (9b) than to the IC chip (28) in plan view in the thickness direction (D1) of the mounting substrate (14).

According to this aspect, the wiring line lengths from the external connection terminal (218, 219) to the first power amplifier (9a) and the second power amplifier (9b) can be reduced.

In a radio-frequency module (1; 1a; 1b) according to a third aspect based on the first or second aspect, the external connection terminal (218, 219) is disposed between an outer peripheral surface (91), which is on the opposite side from second power amplifier (9b), of the first power amplifier (9a) and an outer peripheral surface (92), which is on the opposite side from the first power amplifier (9a), of the second power amplifier (9b) in plan view in a direction (third direction D3), which intersects both the thickness direction (D1) of the mounting substrate (14) and a direction in which the first power amplifier (9a) and the second power amplifier (9b) are arrayed (second direction D2).

According to this aspect, the wiring line lengths from the external connection terminal (218, 219) to the first power amplifier (9a) and the second power amplifier (9b) can be reduced, and as a result, oscillations can be suppressed and infiltration of noise can be reduced.

A radio-frequency module (1b) according to a fourth aspect based on any one of the first to third aspects further includes a capacitive element (15). The capacitive element (15) is connected between ground and a path (R1, R2) connecting the external connection terminal (218, 219) and the first power amplifier (9a) and the second power amplifier (9b).

According to this aspect, circuit simplification can be realized.

In a radio-frequency module (1b) according to a fifth aspect based on the fourth aspect, the external connection terminal (218, 219) overlaps the capacitive element (15) in plan view in the thickness direction (D1) of the mounting substrate (14).

According to this aspect, the wiring line length between the external connection terminal (218, 219) and the capacitive element (15) can be reduced.

In a radio-frequency module (1; 1a; 1b) according to a sixth aspect based on any one of the first to fifth aspects, the external connection terminal (218, 219) does not overlap the first power amplifier (9a) or the second power amplifier (9b) in plan view in the thickness direction (D1) of the mounting substrate (14).

According to this aspect, thermal vias (heat dissipating vias) can be disposed directly below the first power amplifier (9a) and the second power amplifier (9b), and as a result, a heat dissipation property can be improved.

A radio-frequency module (1; 1a; 1b) according to a seventh aspect based on any one of the first to sixth aspects further includes a second external connection terminal (219) different from the first external connection terminal (218) that is the external connection terminal. Each of the first power amplifier (9a) and the second power amplifier (9b) includes a first amplifying unit (91a, 91b) and a second amplifying unit (92a, 92b), which are connected in multiple stages. The first external connection terminal (218) is connected to the first amplifying unit (91a) of the first power amplifier (9a) and the first amplifying unit (91b) of the second power amplifier (9b). The second external connection terminal (219) is connected to the second amplifying unit (92a) of the first power amplifier (9a) and the second amplifying unit (92b) of the second power amplifier (9b).

According to this aspect, it is possible to reduce the size of the mounting substrate (14) in plan view in a thickness direction (D1) of the mounting substrate (14) compared with a case where the external connection terminal is provided for each of the first power amplifier (9a) and the second power amplifier (9b).

In a radio-frequency module (1; 1a; 1b) according to an eighth aspect based on any one of the first to seventh aspects, the first power amplifier (9a) and the second power amplifier (9b) are housed in a single package (16).

According to this aspect, it is possible to reduce the surface area of the mounting substrate (14) in plan view in the thickness direction (D1) of the mounting substrate (14) compared with a case where the first power amplifier (9a) and the second power amplifier (9b) are separately connected to the mounting substrate (14) using wire bonding.

In a radio-frequency module (1; 1a; 1b) according to a ninth aspect based on any one of the first to eighth aspects, the first power amplifier (9a) amplifies a transmission signal of a first frequency band and outputs the amplified transmission signal. The second power amplifier (9b) amplifies a transmission signal of a second frequency band, which is located at a lower frequency than the first frequency band, and outputs the amplified transmission signal.

According to this aspect, the transmission power of a transmission signal of the first frequency band can be made higher than the transmission power of a transmission signal of the second frequency band.

In a radio-frequency module (1; 1a; 1b) according to a tenth aspect based on the ninth aspect, the first frequency band includes a transmission band of a communication band used in time division duplexing (TDD). The second frequency band includes a transmission band of a communication band used in frequency division duplexing (FDD).

According to this aspect, the transmission power of a transmission signal used in TDD can be made higher than the transmission power of a transmission signal used in FDD.

A radio-frequency module (1; 1a; 1b) according to an eleventh aspect based on any one of the first to tenth aspects further includes a controller (20). The controller (20) controls the first power amplifier (9a) and the second power amplifier (9b). The controller (20) makes a period in which a transmission signal is output from the first power amplifier (9a) and a period in which a transmission signal is output from the second power amplifier (9b) different from each other.

According to this aspect, both the first power amplifier (9a) and the second power amplifier (9b) can be controlled using one power supply (21, 22).

A communication device (300) according to a twelfth aspect includes a radio-frequency module (1; 1a; 1b) according to any one of the first to eleventh aspects and a signal processing circuit (301). The signal processing circuit (301) is connected to the radio-frequency module (1; 1a; 1b).

According to this aspect, it is possible to reduce the surface area of the mounting substrate (14) in plan view in the thickness direction (D1) of the mounting substrate (14) compared with a case where the external connection terminal is provided for each of the first power amplifier (9a) and the second power amplifier (9b). In other words, according to this aspect, the mounting substrate (14) can be reduced in size.

While embodiments of the disclosure have been described above, it is to be understood that variations and modifications will be apparent to those skilled in the art without departing from the scope and spirit of the invention. The scope of the disclosure, therefore, is to be determined solely by the following claims.

What is claimed is:

1. A radio-frequency module comprising:
   a mounting substrate having a first main surface and a second main surface on opposite sides of the mounting substrate;
   a first power amplifier that is mounted on the first main surface of the mounting substrate;
   a second power amplifier that is mounted on the first main surface of the mounting substrate;
   a circuit component, which is different from the first power amplifier and the second power amplifier, is mounted on the second main surface of the mounting substrate; and
   an external connection terminal that is
      disposed on the second main surface of the mounting substrate,
      connected to a power supply that supplies a power supply voltage to the first power amplifier and the second power amplifier, and
      connected to both the first power amplifier and the second power amplifier, wherein
   the external connection terminal is disposed between an outer peripheral surface, which is on an opposite side from the second power amplifier, of the first power amplifier and an outer peripheral surface, which is on an opposite side from the first power amplifier, of the second power amplifier in plan view in a direction that intersects both a thickness direction of the mounting substrate and a direction in which the first power amplifier and the second power amplifier are arrayed.

2. The radio-frequency module according to claim 1, further comprising:
   an antenna terminal,
   wherein the circuit component is an IC chip that includes a switch connected to the antenna terminal, and a low-noise amplifier, and
   the external connection terminal is closer to the first power amplifier and the second power amplifier than to the IC chip in plan view in a thickness direction of the mounting substrate.

3. The radio-frequency module according to claim 2, wherein the external connection terminal is disposed between an outer peripheral surface, which is on an opposite side from the second power amplifier, of the first power amplifier and an outer peripheral surface, which is on an opposite side from the first power amplifier, of the second power amplifier in plan view in a direction that intersects both a thickness direction of the mounting substrate and a direction in which the first power amplifier and the second power amplifier are arrayed.

4. The radio-frequency module according to claim 2, further comprising:
   a capacitive element that is connected between ground and a path connecting the external connection terminal and the first power amplifier and the second power amplifier.

5. The radio-frequency module according to claim 4,
   wherein the external connection terminal overlaps the capacitive element in plan view in a thickness direction of the mounting substrate.

6. The radio-frequency module according to claim 2,
   wherein the external connection terminal does not overlap the first power amplifier or the second power amplifier in plan view in a thickness direction of the mounting substrate.

7. The radio-frequency module according to claim 2, further comprising:
   a second external connection terminal that is different from a first external connection terminal that is the external connection terminal,
   wherein each of the first power amplifier and the second power amplifier respectively includes first amplifier circuitry and second amplifier circuitry, which are connected in multiple stages,
   the first external connection terminal is connected to the first amplifier circuitry of the first power amplifier and the first amplifier circuitry of the second power amplifier, and
   the second external connection terminal is connected to the second amplifier circuitry of the first power amplifier and the second amplifier circuitry of the second power amplifier.

8. The radio-frequency module according to claim 2,
   wherein the first power amplifier and the second power amplifier are housed in a single package.

9. A radio-frequency module according to claim 2,
   wherein the first power amplifier is configured to amplify a transmission signal of a first frequency band and output the amplified transmission signal, and
   the second power amplifier is configured to amplify a transmission signal of a second frequency band that is located at a lower frequency than the first frequency band and output the amplified transmission signal.

10. The radio-frequency module according to claim 9,
    wherein the first frequency band includes a transmission band of a time division duplexing (TDD)communication band, and
    the second frequency band includes a transmission band of a frequency division duplexing (FDD)communication band.

11. The radio-frequency module according to claim 1, further comprising:
    a capacitive element that is connected between ground and a path connecting the external connection terminal and the first power amplifier and the second power amplifier.

12. The radio-frequency module according to claim 11,
    wherein the external connection terminal overlaps the capacitive element in plan view in a thickness direction of the mounting substrate.

13. The radio-frequency module according to claim 1, wherein the external connection terminal does not overlap the first power amplifier or the second power amplifier in plan view in a thickness direction of the mounting substrate.

14. The radio-frequency module according to claim 1, further comprising:
a second external connection terminal that is different from a first external connection terminal that is the external connection terminal,
wherein each of the first power amplifier and the second power amplifier respectively includes first amplifier circuitry and second amplifier circuitry, which are connected in multiple stages,
the first external connection terminal is connected to the first amplifier circuitry of the first power amplifier and the first amplifier circuitry of the second power amplifier, and
the second external connection terminal is connected to the second amplifier circuitry of the first power amplifier and the second amplifier circuitry of the second power amplifier.

15. The radio-frequency module according to claim 1, wherein the first power amplifier and the second power amplifier are housed in a single package.

16. A radio-frequency module according to claim 1, wherein the first power amplifier is configured to amplify a transmission signal of a first frequency band and output the amplified transmission signal, and
the second power amplifier is configured to amplify a transmission signal of a second frequency band that is located at a lower frequency than the first frequency band and output the amplified transmission signal.

17. The radio-frequency module according to claim 16, wherein the first frequency band includes a transmission band of a time division duplexing (TDD)communication band, and
the second frequency band includes a transmission band of a frequency division duplexing (FDD)communication band.

18. The radio-frequency module according to claim 1, further comprising:
a controller that controls the first power amplifier and the second power amplifier,
wherein the controller sets an operation period in which a transmission signal is output from the first power amplifier and another operation period in which a transmission signal is output from the second power amplifier different from each other.

19. A communication device comprising:
a radio-frequency module; and
a signal processing circuit that is connected to the radio-frequency module, wherein the radio-frequency module includes
a mounting substrate having a first main surface and a second main surface on opposite sides of the mounting substrate,
a first power amplifier that is mounted on the first main surface of the mounting substrate,
a second power amplifier that is mounted on the first main surface of the mounting substrate,
a circuit component, which is different from the first power amplifier and the second power amplifier, is mounted on the second main surface of the mounting substrate, and
an external connection terminal that is
disposed on the second main surface of the mounting substrate,
connected to a power supply that supplies a power supply voltage to the first power amplifier and the second power amplifier, and
connected to both the first power amplifier and the second power amplifier, wherein
the external connection terminal is disposed between an outer peripheral surface, which is on an opposite side from the second power amplifier, of the first power amplifier and an outer peripheral surface, which is on an opposite side from the first power amplifier, of the second power amplifier in plan view in a direction that intersects both a thickness direction of the mounting substrate and a direction in which the first power amplifier and the second power amplifier are arrayed.

* * * * *